US012581942B2

(12) United States Patent
Tan et al.

(10) Patent No.: US 12,581,942 B2
(45) Date of Patent: Mar. 17, 2026

(54) ELECTRONIC FUSES WITH AN AIRGAP UNDER THE FUSE LINK

(71) Applicant: GlobalFoundries Singapore Pte. Ltd., Singapore (SG)

(72) Inventors: Shyue Seng Tan, Singapore (SG); Zar Lwin Zin, Singapore (SG); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 607 days.

(21) Appl. No.: 17/985,965

(22) Filed: Nov. 14, 2022

(65) Prior Publication Data

US 2024/0162147 A1 May 16, 2024

(51) Int. Cl.
| | |
|---|---|
| *H01L 23/525* | (2006.01) |
| *H01L 21/768* | (2006.01) |
| *H01L 23/528* | (2006.01) |

(52) U.S. Cl.
CPC ...... *H01L 23/5256* (2013.01); *H01L 21/7682* (2013.01); *H01L 23/5283* (2013.01)

(58) Field of Classification Search
CPC ............... H01L 23/5256; H01L 21/764; H01L 21/7682; H01L 23/5283; G11C 17/16
See application file for complete search history.

(56) References Cited

U.S. PATENT DOCUMENTS

| | | | |
|---|---|---|---|
| 4,908,692 A | 3/1990 | Kikuchi et al. | |
| 7,745,855 B2 | 6/2010 | Henson et al. | |
| 8,013,419 B2 | 9/2011 | Kim et al. | |
| 2007/0222028 A1 | 9/2007 | Matsuoka et al. | |
| 2007/0284693 A1 | 12/2007 | Kim et al. | |
| 2008/0079113 A1 | 4/2008 | Chinthakindi et al. | |
| 2008/0179706 A1 | 7/2008 | Kim et al. | |
| 2009/0090993 A1* | 4/2009 | Henson | H01L 23/5256 |
| | | | 257/529 |
| 2009/0096059 A1 | 4/2009 | Chinthakindi et al. | |
| 2011/0272779 A1 | 11/2011 | Kim et al. | |
| 2018/0212023 A1* | 7/2018 | Weber | H10D 84/853 |

FOREIGN PATENT DOCUMENTS

| | | |
|---|---|---|
| JP | H03169049 A | 7/1991 |

OTHER PUBLICATIONS

European Patent Office, Extended European Search Report and Opinion issued in European Patent Application No. 23203930.5 on Apr. 12, 2024; 8 pages.

(Continued)

*Primary Examiner* — John A Bodnar
(74) *Attorney, Agent, or Firm* — Thompson Hine LLP

(57) ABSTRACT

Structures for an electronic fuse and methods of forming an electronic fuse. The structure comprises an electronic fuse including a first terminal, a second terminal, and a fuse link extending from the first terminal to the second terminal. The first terminal, the second terminal, and the fuse link each include a semiconductor layer and a silicide layer. The silicide layer includes a first portion on the first terminal, a second portion on the second terminal, and a third portion on the fuse link. The fuse link includes an airgap between the semiconductor layer and the third portion of the silicide layer.

20 Claims, 7 Drawing Sheets

(56) References Cited

OTHER PUBLICATIONS

Tan, Shyue Seng et al., "Electronic Fuses With a Silicide Layer Having Multiple Thicknesses" filed on Jan. 7, 2022 as a U.S. Appl. No. 17,570,626.

H. Suto, S. Mori, M. Kanno and N. Nagashima, "Systematic Study of the Dopant-Dependent Properties of Electrically Programmable Fuses With Silicided Poly-Si Links Through a Series of I-V Measurements," in IEEE Transactions on Device and Materials Reliability, vol. 7, No. 2, pp. 285-297, Jun. 2007, doi: 10.1109/TDMR. 2007.901606.

* cited by examiner

ELECTRONIC FUSES WITH AN AIRGAP UNDER THE FUSE LINK

BACKGROUND

The disclosure relates generally to semiconductor devices and integrated circuit fabrication and, in particular, to structures for an electronic fuse and methods of forming an electronic fuse.

Programmable devices, such as electronic fuses (efuses), are widely-used elements found in various programmable integrated circuits, such as redundancy circuits of dynamic random access memories and static random access memories, programmable logic devices, input/output circuits, and chip identification circuits. Electronic fuses may also constitute elements of a built-in self-repair system for a chip that internally monitors chip functionality. If needed, the self-repair system can automatically activate one or more electronic fuses in response to a change in a monitored function.

An electronic fuse includes a pair of terminals defining an anode and a cathode, as well as a narrow fuse link connecting the anode and cathode. When manufactured and unprogrammed, an electronic fuse is initially intact as a conductive bridge connecting the anode and cathode. Electronic fuses may be irreversibly programmed by passing an electrical current of relatively high current density through the fuse link. A large programming current may cause an abrupt temperature increase in the fuse link that blows the fuse link as a result of electromigration. The electronic fuse in its programmed state has a significantly higher electrical resistance than the electronic fuse in its unprogrammed state.

Conventional electronic fuses may suffer from low programming efficiency. Conventional electronic fuses may also suffer from resistance variations in the programmed state, which may produce unacceptable variations between electronic fuses in the same integrated circuit or among electronic fuses in different integrated circuits.

Improved structures for an electronic fuse and methods of forming an electronic fuse are needed.

SUMMARY

In an embodiment, a structure comprises an electronic fuse including a first terminal, a second terminal, and a fuse link extending from the first terminal to the second terminal. The first terminal, the second terminal, and the fuse link each include a semiconductor layer and a silicide layer. The silicide layer includes a first portion on the first terminal, a second portion on the second terminal, and a third portion on the fuse link. The fuse link includes an airgap between the semiconductor layer and the third portion of the silicide layer.

In an embodiment, a structure comprises an electronic fuse including a first terminal, a second terminal, and a fuse link extending from the first terminal to the second terminal. The first terminal, the second terminal, and the fuse link each include a semiconductor layer and a silicide layer, and the silicide layer includes a first portion on the first terminal, a second portion on the second terminal, and a third portion on the fuse link. The structure further comprises an interlayer dielectric layer over the electronic fuse. The interlayer dielectric layer comprises a dielectric material, and a portion of the dielectric material is positioned between the semiconductor layer included in the fuse link and the third portion of the silicide layer.

In an embodiment, a method comprises forming an electronic fuse including a first terminal, a second terminal, and a fuse link extending from the first terminal to the second terminal. The first terminal, the second terminal, and the fuse link each include a semiconductor layer and a silicide layer, and the silicide layer includes a first portion on the first terminal, a second portion on the second terminal, and a third portion on the fuse link. The method further comprises forming an airgap between the semiconductor layer included in the fuse link and the third portion of the silicide layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
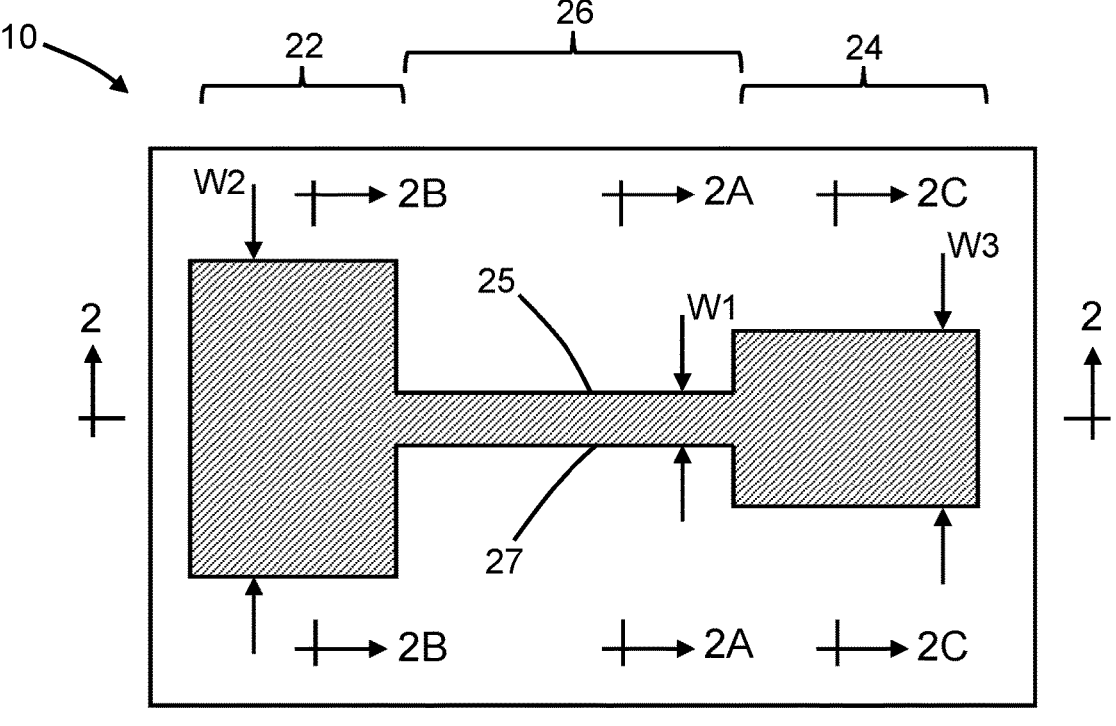
FIG. 1 is a top view of a structure for an electronic fuse at an initial fabrication stage of a fabrication method in accordance with embodiments of the invention.

With reference to FIGS. 1, 2, 2A, 2B, 2C and in accordance with embodiments of the invention, an electronic fuse 10 (i.e., efuse) may be formed on a dielectric layer 12. The dielectric layer 12 may be comprised of a dielectric material, such as silicon dioxide, that is an insulator. The electronic fuse 10 may include a layer stack having a semiconductor layer 14, a semiconductor layer 16, and a semiconductor layer 18. The semiconductor layer 16 is positioned in a vertical direction between the semiconductor layer 14 and the semiconductor layer 18. The semiconductor layer 14 may be in direct contact with the dielectric layer 12, and the semiconductor layer 16 may be in direct contact with the semiconductor layer 14 and the semiconductor layer 18. The dielectric layer 12 may be positioned on a substrate 15, such as a bulk silicon substrate. The electronic fuse 10 may be patterned from the layer stack by lithography and etching processes.

The semiconductor layer 14 and the semiconductor layer 18 may be comprised of a semiconductor material, such as single-crystal silicon. The semiconductor layer 16 may be comprised of a different semiconductor material, such as silicon-germanium (SiGe). In an embodiment, the semiconductor material of the semiconductor layer 16 may be chosen to be etched and removed selective to the semiconductor material constituting the semiconductor layer 14 and the semiconductor layer 18. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor layer 16 may be comprised of silicon-germanium with a germanium content ranging from twenty percent (20%) to thirty-five percent (35%), which etches at a higher rate than the semiconductor layer 14 and the semiconductor layer 18 exclusively comprised of silicon.

The electronic fuse 10 includes a terminal 22, a terminal 24, and a fuse link 26 that is positioned between the terminal 22 and the terminal 24 and that connects the terminal 22 to the terminal 24. The terminals 22, 24 and the fuse link 26 are defined to shape and dimensions when the layer stack is patterned. The fuse link 26 has a narrower cross-sectional area than either the terminal 22 or the terminal 24 and, in particular, the fuse link 26 may have a width W1 that is less than the width W2 of the terminal 22 and less than the width W3 of the terminal 24. The fuse link 26 may have opposite sidewalls 25, 27 that each extend along a length of the fuse link 26 from the terminal 22 to the terminal 24 and between which the width W1 may be measured. In an embodiment, the terminal 22 may define a cathode of the electronic fuse 10, and the terminal 24 may define an anode of the electronic fuse 10. In an embodiment, the semiconductor material constituting the semiconductor layer 16 may have a lower thermal conductivity than the semiconductor material constituting the semiconductor layer 14 or the semiconductor material constituting the semiconductor layer 18, which may be effective to reduce the composite thermal conductivity of the terminals 22, 24.

With reference to FIGS. 3, 3A, 3B, 3C in which like reference numerals refer to like features in FIGS. 2, 2A, 2B, 2C and at a subsequent fabrication stage, a cavity 30 may be defined between the semiconductor layer 14 and the semiconductor layer 18. In an embodiment, the semiconductor layer 16 may be removed from the fuse link 26 without removing the semiconductor layers 14, 16 included in the fuse link 26. In an embodiment, the semiconductor layer 16 may be fully removed from the fuse link 26. In an embodiment, the cavity 30 may extend in a vertical direction from the semiconductor layer 14 to the semiconductor layer 18. In an embodiment, the cavity 30 may extend across the full width W1 of the fuse link 26. In an embodiment, the cavity 30 may extend in a vertical direction from the semiconductor layer 14 to the semiconductor layer 18, and the cavity 30 may extend across the full width W1 of the fuse link 26. The portion of the semiconductor layer 18 included in the fuse link 26, which is suspended over the cavity 30, is mechanically supported at opposite ends by the terminals 22, 24. The semiconductor layer 16 may be recessed relative to the semiconductor layer 14 and the semiconductor layer 18 in the terminals 22, 24 such that the terminal 22 is surrounded on multiple sides at its perimeter by a cavity 32 and the terminal 24 is surrounded on multiple sides at its perimeter by a cavity 34.

4

Figure 2:
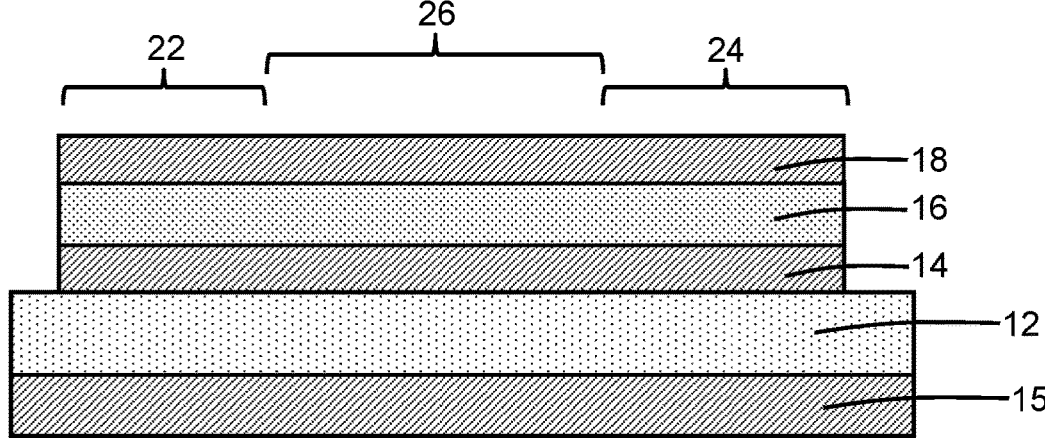
FIG. 2 is a cross-sectional view taken generally along line 2-2 in FIG. 1.
Figure 2A:
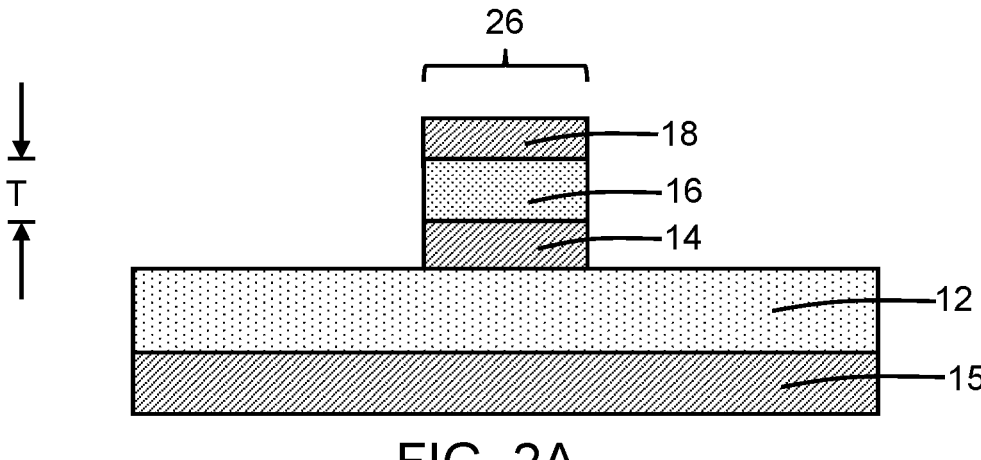
FIG. 2A is a cross-sectional view taken generally along line 2A-2A in FIG. 1.
Figure 2B:
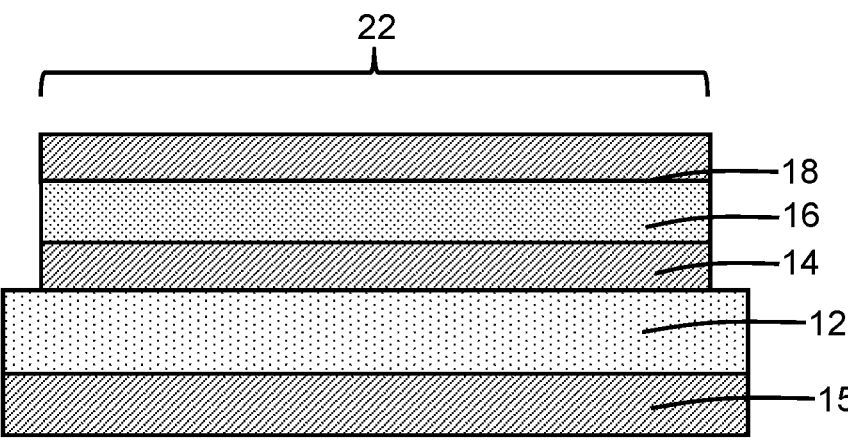
FIG. 2B is a cross-sectional view taken generally along line 2B-2B in FIG. 1.
Figure 2C:
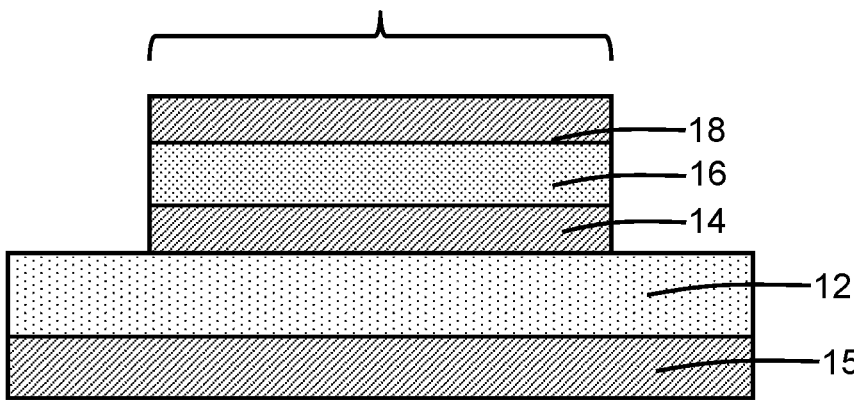
FIG. 2C is a cross-sectional view taken generally along line 2C-2C in FIG. 1.
Figure 3:
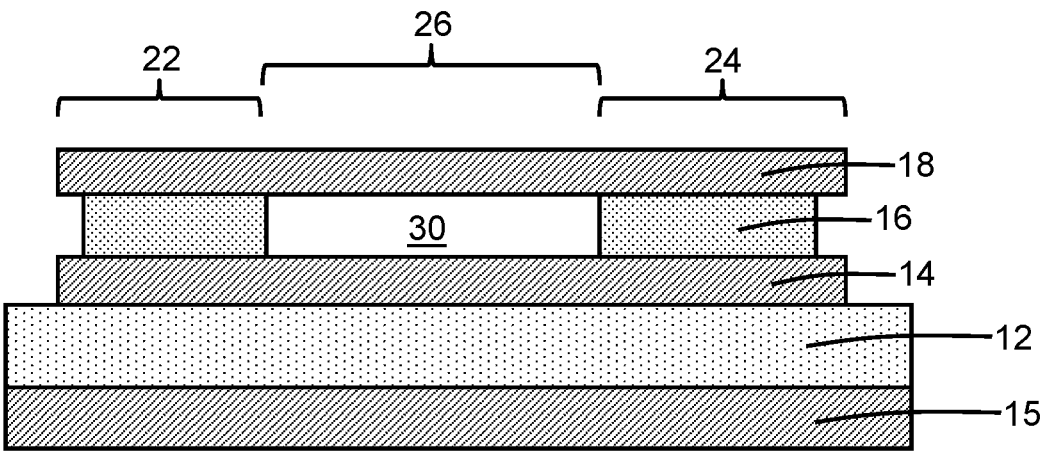
FIGS. 3, 3A, 3B, and 3C are cross-sectional views of the structure at a fabrication stage subsequent to FIGS. 2, 2A, 2B, and 2C.
Figure 3A:
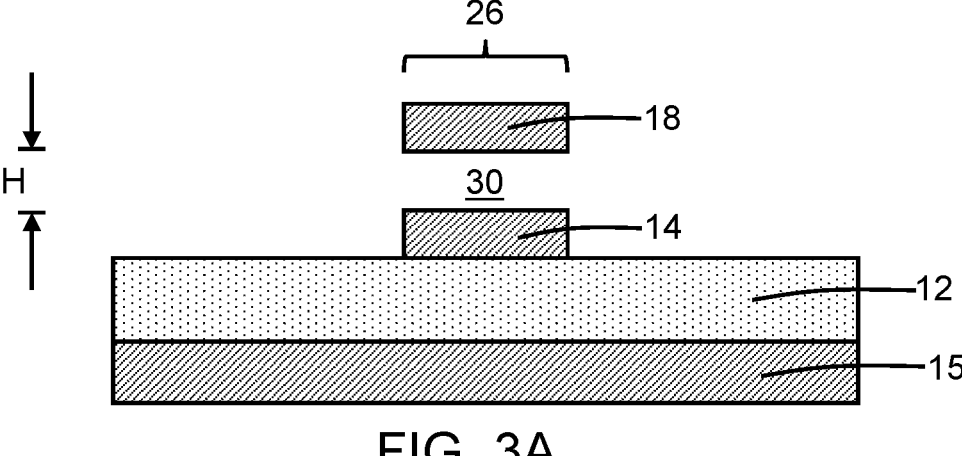
Figure 3B:
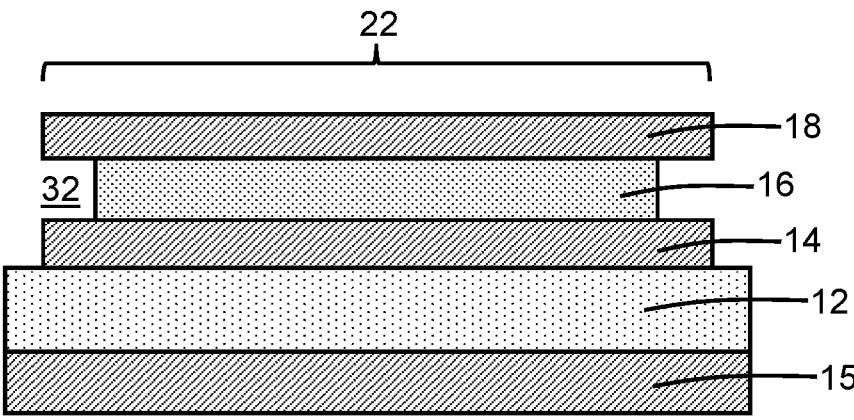
Figure 3C:
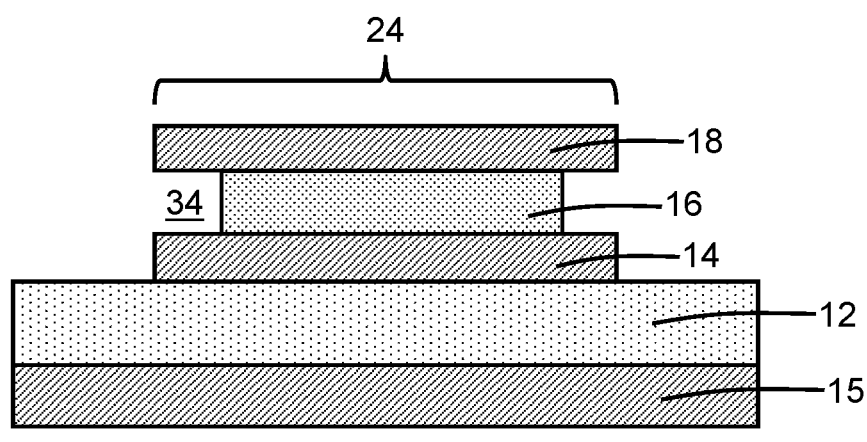
Figure 4:
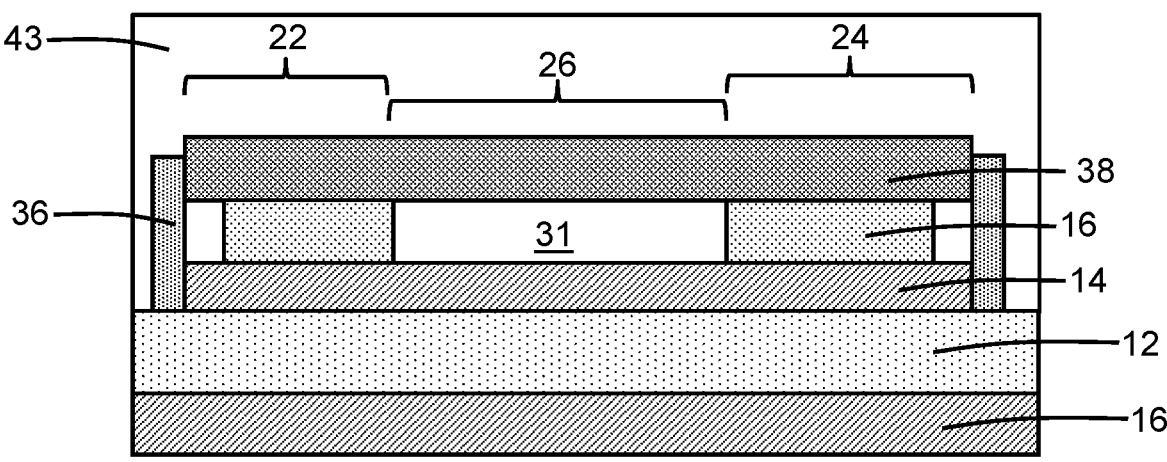
FIGS. 4, 4A, 4B, and 4C are cross-sectional views of the structure at a fabrication stage subsequent to FIGS. 3, 3A, 3B, and 3C.
Figure 4A:
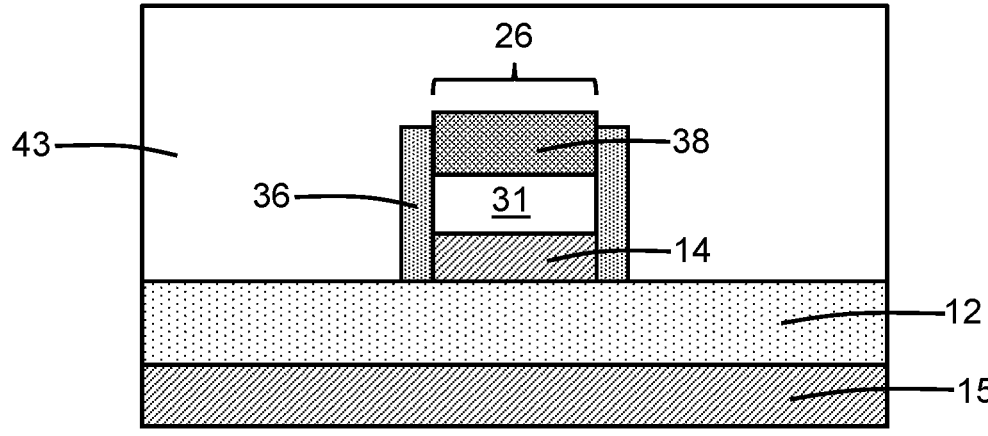
Figure 4B:
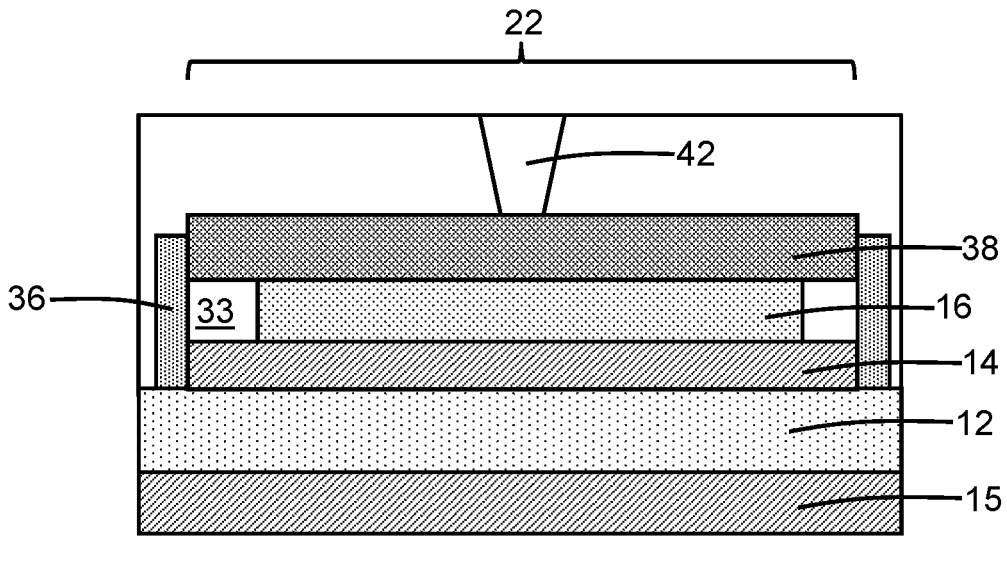
Figure 4C:
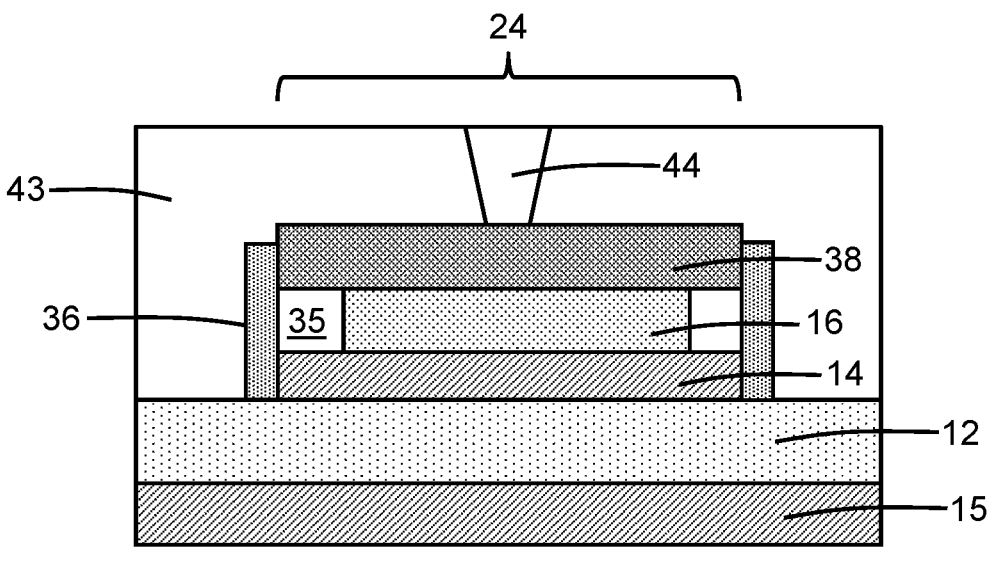

The cavities 30, 32, 34 may be formed by selectively etching the semiconductor layer 16 relative to the semiconductor layer 14 and the semiconductor layer 18 using an isotropic etching process that removes the semiconductor material of the semiconductor layer 16 preferentially to the semiconductor material of the semiconductor layer 14 and the semiconductor layer 18. In an embodiment, the isotropic etching process may rely on an etch chemistry, such as hot ammonia and/or hydrochloric acid vapor, that removes the material (e.g., silicon-germanium) of the semiconductor layer 16 selective to the material (e.g., silicon) of the semiconductor layer 14 and the semiconductor layer 18. In the terminal 22 and the terminal 24, the semiconductor layer 16 is laterally recessed relative to the semiconductor layer 14 and the semiconductor layer 18, and a portion of the semiconductor layer 16 remains between the semiconductor layer 14 and the semiconductor layer 18. In an embodiment, the height H of the cavities 30, 32, 34 may be equal, or substantially equal, to the thickness T of the semiconductor layer 16 (FIG. 2A).

With reference to FIGS. 4, 4A, 4B, 4C in which like reference numerals refer to like features in FIGS. 3, 3A, 3B, 3C and at a subsequent fabrication stage, a spacer 36 is formed that extends about the perimeter of the terminals 22, 24 and that is positioned adjacent to each of the sidewalls 25, 27 of the fuse link 26. The spacer 36 may be formed by depositing a conformal layer of a dielectric material, such as silicon nitride, and etching the deposited layer with an anisotropic etching process. The cavity 30 is converted to an airgap 31 that is confined between the semiconductor layer 16 in the terminal 22, the semiconductor layer 16 in the terminal 24, and the portions of the spacer 36 along the opposite sidewalls 25, 27 of the fuse link 26. The airgap 31 is longitudinally positioned between the portion of the semiconductor layer 16 included in the terminal 22 and the portion of the semiconductor layer 16 included in the terminal 24. The cavity 32 is converted to an airgap 33 that is confined between the semiconductor layer 16 of the terminal 22 and a portion of the spacer 36 surrounding the terminal 22. The cavity 34 is converted to an airgap 35 that is confined between the semiconductor layer 16 of the terminal 24 and a portion of the spacer 36 surrounding the terminal 24.

The airgaps 31, 33, 35 may be filled by atmospheric air at or near atmospheric pressure, may be filled by another gas at or near atmospheric pressure, or may contain atmospheric air or another gas at a sub-atmospheric pressure (e.g., a partial vacuum). The airgaps 31, 33, 35 may be characterized by a permittivity or dielectric constant of near unity (i.e., vacuum permittivity), which is less than the dielectric constant of a solid dielectric material.

A silicide layer 38 is formed that includes a portion on the terminal 22, a portion on the terminal 24, and a portion on the fuse link 26. The formation of the silicide layer 38 may consume the semiconductor material of the semiconductor layer 18. In an embodiment, the formation of the silicide layer 38 may fully consume the semiconductor material of the semiconductor layer 18. The silicide layer 38 may be formed by a silicidation process that involves one or more annealing steps to form a silicide phase by reacting the semiconductor material of the semiconductor layer 18 with a contacting layer comprised of a silicide-forming metal, such as nickel, that is deposited on the semiconductor layer 18. An initial annealing step of the silicidation process may consume all or part of the silicide-forming metal and may consume all of the semiconductor layer 18 to form the silicide layer 38. Following the initial annealing step, any non-reacted silicide-forming metal may be removed by wet chemical etching. The silicide layer 38 may then be subjected to an additional annealing step at a higher temperature to form a lower-resistance silicide phase.

The portion of the silicide layer 38 included in the fuse link 26 is positioned over the airgap 31. In an embodiment, the portion of the silicide layer 38 included in the fuse link 26 may fully replace the portion of the semiconductor layer 18 of the fuse link 26 such that the silicide layer 38 of the fuse link 26 is coextensive with the airgap 31. In an embodiment, the portion of the silicide layer 38 included in the fuse link 26 may have a uniform or substantially uniform thickness, which may be due to a complete reaction of the semiconductor layer 18 over the airgap 31 during silicidation to form the silicide layer 38. The portion of the semiconductor layer 14 included in the fuse link 26 may also be extensive with the airgap 31.

Forming the silicide layer 38 included in the fuse link 26 over the airgap 31 may improve the process control over the silicide thickness and may also promote the ability to form a thin and uniform silicide as the thickness of the semiconductor layer 16 is a constraint. The programming efficiency of the electronic fuse 10 may be improved by, for example, enhancing the electromigration effect that is induced by the heating of the portion of the silicide layer 38 included in the fuse link 26, which is thermally isolated from the semiconductor layer 14 by the airgap 31. The improved programming efficiency may enable a lower programming current and/or a smaller footprint for the electronic fuse 10.

Middle-of-line processing follows to form an interconnect structure having an interlayer dielectric layer 43 and contacts 42, 44. The contacts 42 are coupled to the terminal 22 of the electronic fuse 10, and the contacts 44 are coupled to the terminal 24 of the electronic fuse 10. The fuse link 26 may be non-contacted. In an embodiment, the interlayer dielectric layer 43 may be comprised of a dielectric material, such as silicon dioxide, and the contacts 42, 44 may be comprised of a metal, such as tungsten.

Before programming is initiated, the electronic fuse 10 has an initial state characterized by a low value of electrical resistance. Specifically, in the initial unprogrammed state, the fuse link 26 defines a closed circuit path of low resistance that extends from the terminal 22 to the terminal 24. The terminals 22, 24 of the electronic fuse 10 may be connected by the contacts 42, 44 with programming circuitry, which may include one or more transistors designed to draw a large amount of current. The electronic fuse 10 may also be connected by the contacts 42, 44 with sense circuitry that reads the state of the electronic fuse 10. The sense circuitry can measure the electrical resistance of the electronic fuse 10 to determine whether or not the electronic fuse 10 has been programmed. Control logic directs the fuse program operations of the programming circuitry and the fuse read operations of the sense circuitry.

During programming of the electronic fuse 10, a voltage is applied between terminal 22 and the terminal 24 either in a pulse train or as a lengthier single pulse. Electrical current with a high current density flows through the fuse link 26 and, in particular, primarily flows through the portion of the silicide layer 38 included in the fuse link 26. As electrical current flows through the fuse link 26, ohmic heating occurs that rapidly increases the temperature of the fuse link 26 and promotes electromigration of the portion of the silicide layer 38 included in the fuse link 26. The airgap 31 may provide efficient thermal isolation that promotes a rapid temperature increase. The fuse link 26 will eventually blow as the temperature increases, after which the programmed electronic fuse 10 will exhibit a high electrical resistance. In the blown state, the silicide layer 38 may include a discontinuity within the fuse link 26. Once programmed, the electronic fuse 10 cannot be re-programmed back to a low-resistance state because the programming operation is irreversible. The airgap 31 included in the fuse link 26 contributes to mimicking an open circuit when the fuse link 26 is blown, which may provide tighter control over the resistance among different programmed electronic fuses 10 and reduce the variation between different programmed electronic fuses 10.

Figure 5:
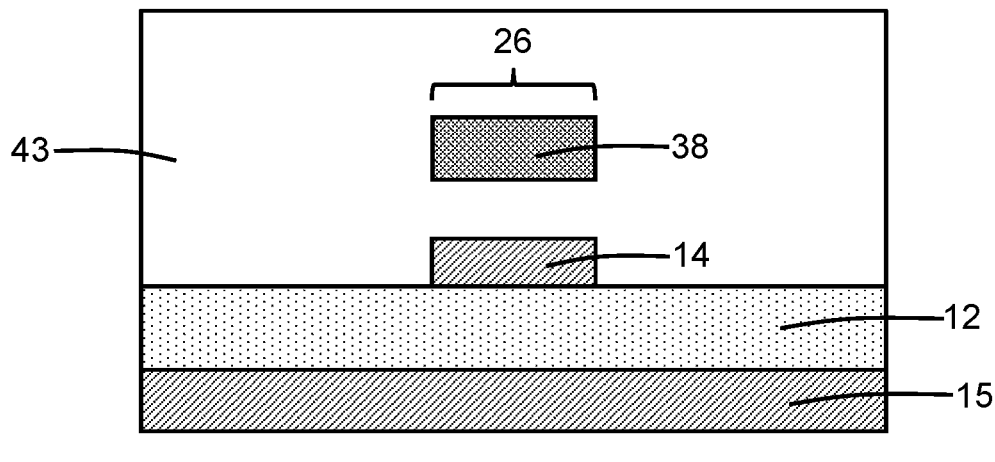
FIG. 5 is a cross-sectional view of a structure for an electronic fuse in accordance with alternative embodiments of the invention.

With reference to FIG. 5 and in accordance with alternative embodiments, the spacers 36 may be omitted such that the cavity 30 (FIGS. 3, 3A) is not closed to define an airgap. Instead, a portion of the dielectric material of the interlayer dielectric layer 43 may fill the cavity 30. In an embodiment, the dielectric material of the interlayer dielectric layer 43 may fully fill the cavity 30. In an embodiment, the dielectric material may extend from the semiconductor layer 14 to the semiconductor layer 18 and may directly contact each of the semiconductor layers 14, 18. The dielectric material has a lower thermal conductivity than the semiconductor layer 16 that is removed to form the cavity 30 and a lower thermal conductivity than either of the semiconductor layers 14, 18.

Figure 6:
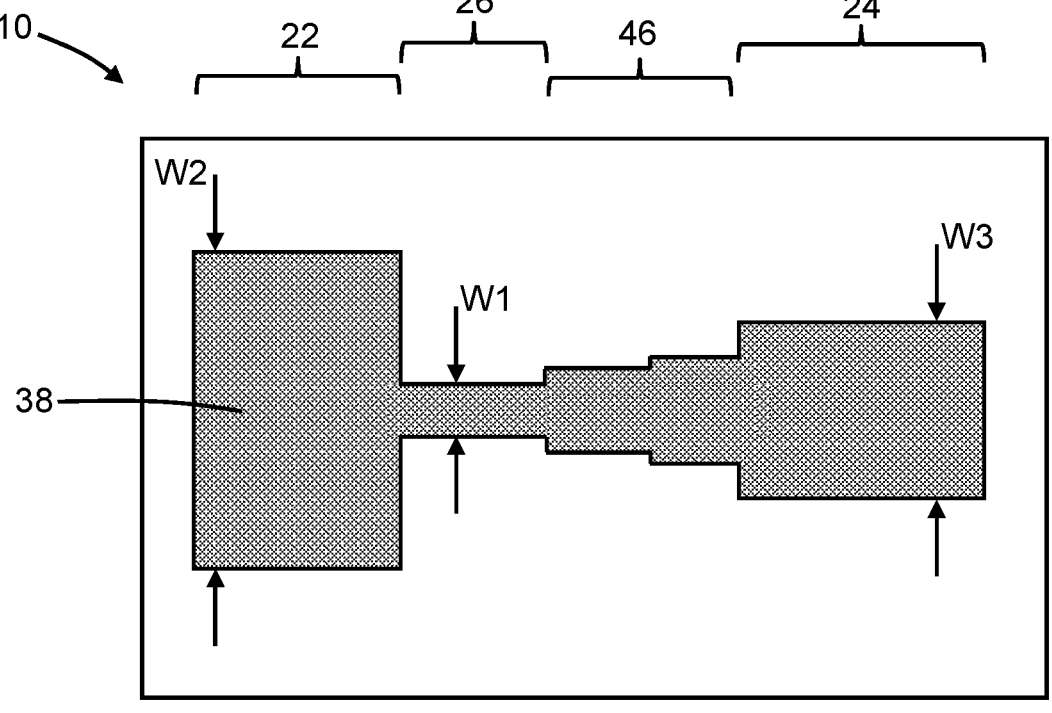
FIG. 6 is a top view of a structure for an electronic fuse in accordance with alternative embodiments of the invention.

With reference to FIG. 6 and in accordance with alternative embodiments, the terminal 24 may be formed with an extension section 46 that may effectively shorten the length of the fuse link 26 and reduce the size of the airgap 31. The extension section 46 may be defined when the layer stack is patterned by lithography and etching processes to form the terminals 22, 24 and fuse link 26. In an embodiment, the extension section 46 may be longitudinally positioned between the terminal 24 and the fuse link 26. In an embodiment, the extension section 46 may be tiered with multiple sections of different widths that are dimensioned intermediate between the width W1 of the fuse link 26 and the width W3 of the terminal 24. In an embodiment, the width of the extension section 46 may decrease with increasing distance from the terminal 24. The extension section 46 may include the semiconductor layer 14, the silicide layer 38, and the laterally-recessed semiconductor layer 16 and, as a result, the airgap 35 (FIG. 4C) between the semiconductor layer 14 and the silicide layer 38 may extend into the extension section 46. The airgap 31 (FIG. 4A) of the fuse link 26 may terminate at the semiconductor layer 16 in the extension section 46 instead of at the terminal 24. The shorter length of the portion of the silicide layer 38 of the fuse link 26 can be engineered to confine the region over which the electronic fuse 10 is blown by programming.

Figure 7:
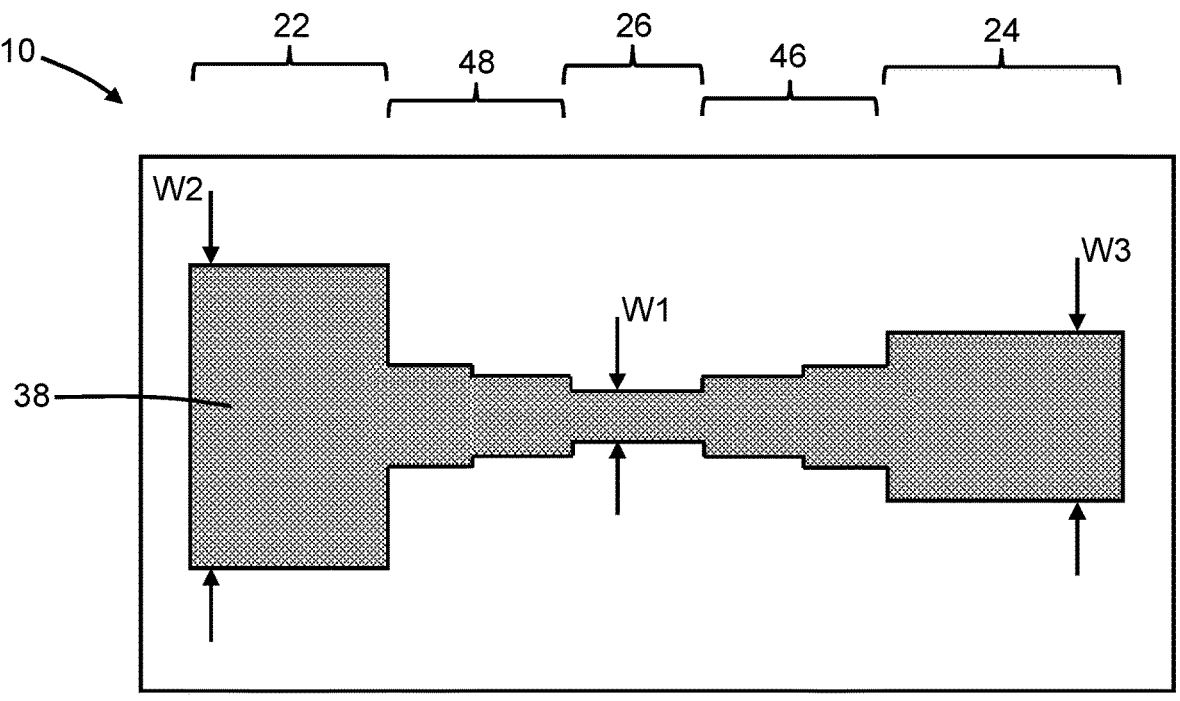
FIG. 7 is a top view of a structure for an electronic fuse in accordance with alternative embodiments of the invention.

With reference to FIG. 7 and in accordance with alternative embodiments, the terminal 22 may be formed with an extension section 48 that may effectively shorten the length of the fuse link 26 and reduce the size of the airgap 31. The extension section 48 may be defined when the layer stack is patterned by lithography and etching processes to form the terminals 22, 24 and fuse link 26. In an embodiment, the extension section 46 may be longitudinally positioned between the terminal 22 and the fuse link 26. In an embodiment, the extension section 48 may be tiered with multiple sections of different widths that are dimensioned intermediate between the width W1 of the fuse link 26 and the width W2 of the terminal 22. In an embodiment, the width of the extension section 48 may decrease with increasing distance from the terminal 22. The extension section 48 may include the semiconductor layer 14, the silicide layer 38, and the laterally-recessed semiconductor layer 16 and, as a result, the airgap 33 (FIG. 4B) between the semiconductor layer 14 and the silicide layer 38 may extend into the extension section 48. The airgap 31 (FIG. 4A) may terminate at the semiconductor layer 16 in the extension section 48 instead of at the terminal 22. The shorter length of the portion of the silicide layer 38 can be engineered to confine the region over which the electronic fuse 10 is blown by programming.

In the representative embodiment, the extension section 46 is also present between the fuse link 26 and the terminal 24. In an alternative embodiment, the extension section 46 may be absent between the fuse link 26 and the terminal 24 such that the fuse link 26 is connected to the terminal 24.

Figure 8:
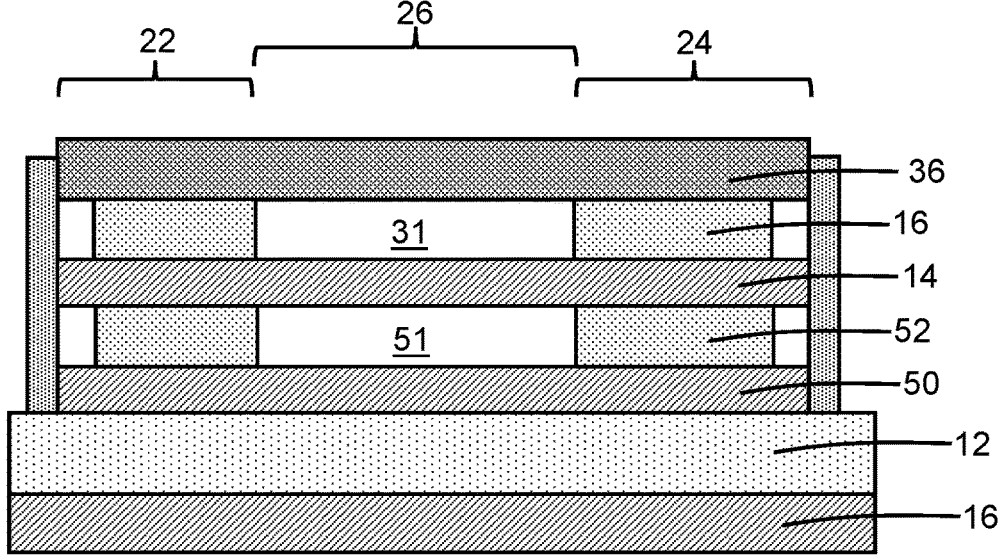
FIG. 8 is a cross-sectional view of a structure for an electronic fuse in accordance with alternative embodiments of the invention.

With reference to FIG. 8 and in accordance with alternative embodiments, the layer stack of the electronic fuse 10 may further include a semiconductor layer 50 similar or identical to semiconductor layer 14 and a semiconductor layer 52 similar or identical to the semiconductor layer 16. The portion of the semiconductor layer 52 in the fuse link 26 may be removed, along with the semiconductor layer 16, to define another airgap 51 that is located between the semiconductor layer 14 and the semiconductor layer 50. The additional airgap 51 may further enhance electromigration effect that is induced by the heating of the silicide layer 38 of the fuse link 26 and, as a result, further improve the programming efficiency of the electronic fuse 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a dielectric layer; and
an electronic fuse including a first terminal, a second terminal, and a fuse link extending from the first terminal to the second terminal, the electronic fuse including a first semiconductor layer on the dielectric layer, a second semiconductor layer, and a silicide layer, the first terminal including a first portion of the silicide layer, a first portion of the first semiconductor layer, and a first portion of the second semiconductor layer between the first portion of the silicide layer and the first portion of the first semiconductor layer, the second terminal including a second portion of the silicide layer, a first portion of the first semiconductor layer, and a first portion of the second semiconductor layer between the first portion of the silicide layer and the first portion of the first semiconductor layer, and the fuse link including a third portion of the silicide layer, a third portion of the first semiconductor layer, and a first airgap between the third portion of the first semiconductor layer and the third portion of the silicide layer.

2. The structure of claim 1 wherein the third portion of the silicide layer has a uniform thickness.

3. The structure of claim 1 wherein the first semiconductor layer comprises a first semiconductor material, and the second semiconductor layer comprises a second semiconductor material having a different composition from the first semiconductor material.

4. The structure of claim 3 wherein the first semiconductor material is silicon, and the second semiconductor material is silicon-germanium.

5. The structure of claim 1 wherein the first terminal is surrounded by a first recess between the first portion of the silicide layer and the first portion of the first semiconductor layer, and the second terminal is surrounded by a second recess between the second portion of the silicide layer and the second portion of the first semiconductor layer.

6. The structure of claim 1 wherein the first airgap is longitudinally positioned between the first portion of the second semiconductor layer included in the first terminal and the second portion of the second semiconductor layer included in the second terminal.

7. The structure of claim 6 wherein the fuse link has a sidewall, and further comprising:
a spacer adjacent to the sidewall of the fuse link.

8. The structure of claim 1 wherein the second semiconductor layer has a thickness, and the first airgap has a height equal to the thickness of the second semiconductor layer.

9. The structure of claim 1 wherein the third portion of the silicide layer is coextensive with the first airgap.

10. The structure of claim 9 wherein the first airgap is coextensive with the third portion of the first semiconductor layer.

11. The structure of claim 1 wherein the the electronic fuse includes a third semiconductor layer, and the fuse link includes a second airgap between the third portion of the first semiconductor layer and the third semiconductor layer.

12. The structure of claim 1 wherein the first terminal includes a first extension section arranged adjacent to the fuse link, and the first extension section has a first width that is less than a width of the first terminal and greater than a width of the fuse link.

13. The structure of claim 12 wherein the second terminal includes a second extension section arranged adjacent to the fuse link, and the second extension section has a second width that is less than the width of the first terminal and greater than the width of the fuse link.

14. The structure of claim 13 wherein the fuse link is arranged between the first extension section and the second extension section.

15. The structure of claim 1 wherein the fuse link has a sidewall, and further comprising:

a spacer adjacent to the sidewall of the fuse link.

16. A structure comprising:

a dielectric layer;

an electronic fuse including a first terminal, a second terminal, and a fuse link extending from the first terminal to the second terminal, the electronic fuse including a first semiconductor layer on the dielectric layer, a second semiconductor layer, and a silicide layer, the silicide layer including a first portion on the first terminal, a second portion on the second terminal, and a third portion on the fuse link, the first terminal including a first portion of the silicide layer, a first portion of the first semiconductor layer, and a first portion of the second semiconductor layer between the first portion of the silicide layer and the first portion of the first semiconductor layer, the second terminal including a second portion of the silicide layer, a first portion of the first semiconductor layer, and a first portion of the second semiconductor layer between the first portion of the silicide layer and the first portion of the first semiconductor layer, and the fuse link including a third portion of the silicide layer and a third portion of the first semiconductor layer; and an interconnect structure including an interlayer dielectric layer over the electronic fuse, a first contact in the interlayer dielectric layer that is coupled to the first terminal, and a second contact in the interlayer dielectric layer that is coupled to the second terminal, the interlayer dielectric layer comprising a dielectric material, and a portion of the dielectric material fully filling a cavity between the third portion of the first semiconductor layer and the third portion of the silicide layer.

17. The structure of claim 1 wherein the dielectric layer comprises silicon dioxide.

18. The structure of claim 16 wherein the interlayer dielectric layer comprises silicon dioxide.

19. The structure of claim 1 wherein the first airgap directly adjoins the third portion of the silicide layer.

20. A method comprising:

forming an electronic fuse including a first terminal, a second terminal, and a fuse link extending from the first terminal to the second terminal, the electronic fuse including a first semiconductor layer on a dielectric layer, a second semiconductor layer, and a silicide layer, the silicide layer including a first portion on the first terminal, a second portion on the second terminal, and a third portion on the fuse link, the first terminal including a first portion of the silicide layer, a first portion of the first semiconductor layer, and a first portion of the second semiconductor layer between the first portion of the silicide layer and the first portion of the first semiconductor layer, the second terminal including a second portion of the silicide layer, a first portion of the first semiconductor layer, and a first portion of the second semiconductor layer between the first portion of the silicide layer and the first portion of the first semiconductor layer, and the fuse link including a third portion of the silicide layer, a third portion of the first semiconductor layer, and an airgap between the third portion of the first semiconductor layer and the third portion of the silicide layer.

* * * * *